US011127609B2

(12) United States Patent
Kim et al.

(10) Patent No.: US 11,127,609 B2
(45) Date of Patent: Sep. 21, 2021

(54) COLLET APPARATUS AND METHOD FOR FABRICATING A SEMICONDUCTOR DEVICE USING THE SAME

(71) Applicant: SAMSUNG ELECTRONICS CO., LTD., Suwon-si (KR)

(72) Inventors: Doo Jin Kim, Asan-si (KR); Young Sik Kim, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 9 days.

(21) Appl. No.: 16/791,996

(22) Filed: Feb. 14, 2020

(65) Prior Publication Data

US 2020/0402824 A1 Dec. 24, 2020

(30) Foreign Application Priority Data

Jun. 24, 2019 (KR) .................. 10-2019-0074804

(51) Int. Cl.
*H01L 21/677* (2006.01)
*H01L 21/67* (2006.01)

(52) U.S. Cl.
CPC .. *H01L 21/67144* (2013.01); *H01L 21/67259* (2013.01); *H01L 21/67703* (2013.01)

(58) Field of Classification Search
CPC ......... H01L 21/67144; H01L 21/67259; H01L 21/67703; H01L 21/6838; H01L 21/67288; G01R 31/2893
See application file for complete search history.

(56) References Cited

U.S. PATENT DOCUMENTS

| 3,696,229 | A | * | 10/1972 | Angelucci | ......... | H01L 21/67144 |
| | | | | | | 219/85.16 |
| 7,402,995 | B2 | * | 7/2008 | Adachi | ............... | H01L 21/6838 |
| | | | | | | 324/757.01 |
| 9,434,555 | B2 | * | 9/2016 | Maeda | .................... | B65G 49/00 |
| 2012/0126844 | A1 | * | 5/2012 | Yasuta | ............... | G01R 31/2893 |
| | | | | | | 324/756.07 |
| 2014/0265094 | A1 | | 9/2014 | Kobashi et al. | | |
| 2020/0395521 | A1 | * | 12/2020 | Brodoceanu | ............ | H01L 33/62 |
| 2020/0402824 | A1 | * | 12/2020 | Kim | .................. | H01L 21/67259 |
| 2021/0005498 | A1 | * | 1/2021 | Lam | ...................... | H01L 21/677 |

FOREIGN PATENT DOCUMENTS

| KR | 20010038101 | 5/2001 |
| KR | 20080007716 | 1/2008 |
| KR | 100864227 | 10/2008 |
| KR | 20080109770 | 12/2008 |
| KR | 20090005551 | 1/2009 |
| KR | 20090065253 | 8/2009 |
| KR | 20100006154 | 1/2010 |
| KR | 101385443 | 4/2014 |
| KR | 10-1395536 | 5/2014 |
| KR | 101897088 | 9/2018 |

\* cited by examiner

*Primary Examiner* — Jarrett J Stark
(74) *Attorney, Agent, or Firm* — F. Chau & Associates, LLC

(57) ABSTRACT

A collet apparatus is provided including a body. A first adsorption unit is connected to the body. A second adsorption unit is connected to the first adsorption unit. The second adsorption unit adsorbs a semiconductor chip. An illumination unit is disposed inside the body, and provides a light to the semiconductor chip adsorbed onto the second adsorption unit to examine the semiconductor chip.

17 Claims, 15 Drawing Sheets

FIG. 12
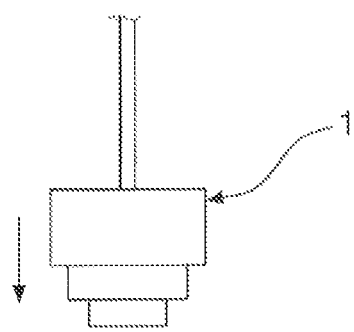
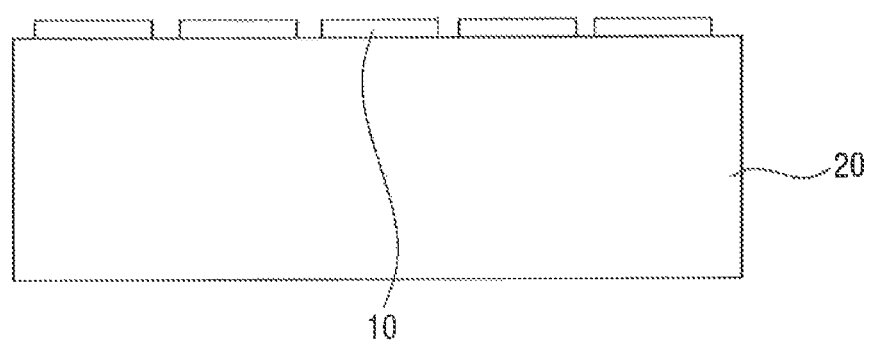
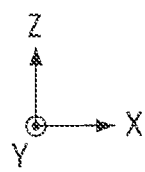

FIG. 13
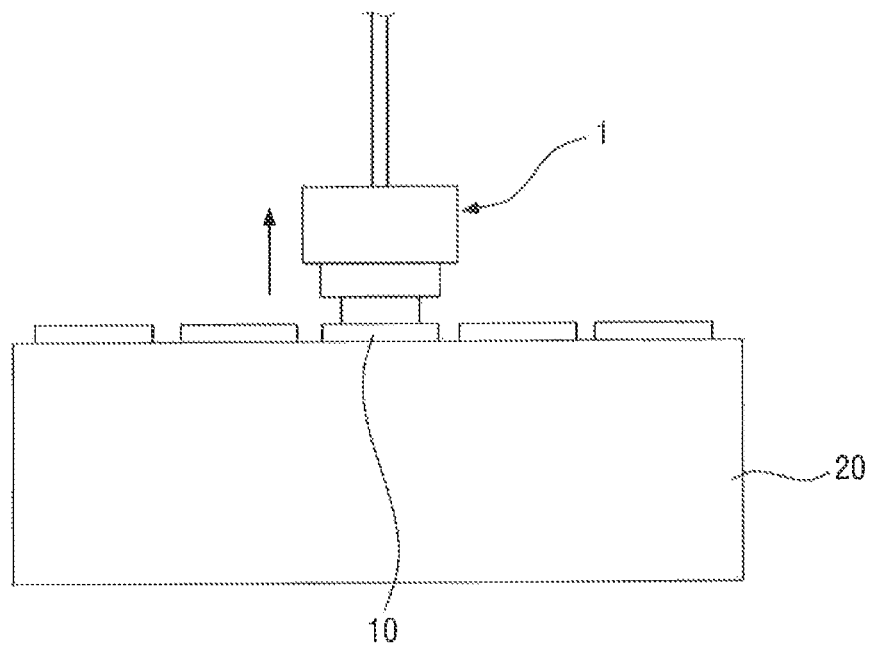
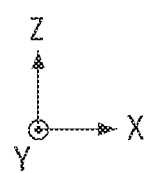

FIG. 14
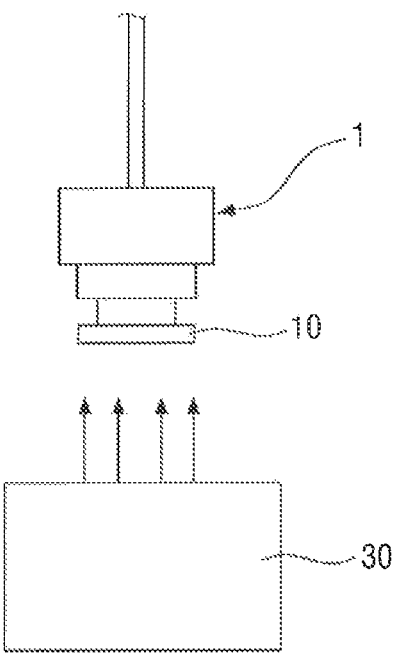
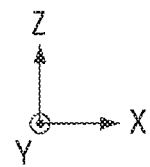

FIG. 15
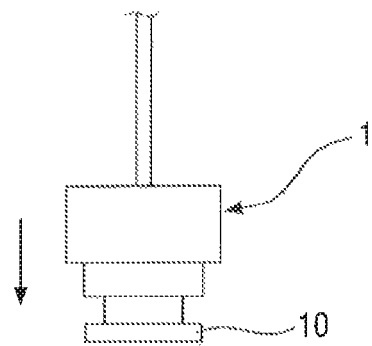
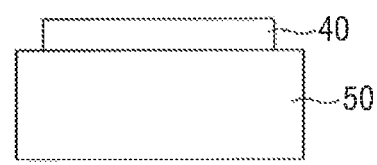
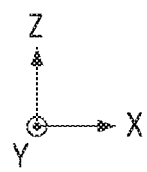

COLLET APPARATUS AND METHOD FOR FABRICATING A SEMICONDUCTOR DEVICE USING THE SAME

CROSS-REFERENCE TO RELATED APPLICATION

This application claims priority under 35 U.S.C. § 119 to Korean Patent Application No. 10-2019-0074804, filed on Jun. 24, 2019, the disclosure of which is incorporated by reference herein in its entirety.

TECHNICAL FIELD

The present disclosure relates to a collet apparatus and a method for fabricating a semiconductor device using the same.

DISCUSSION OF THE RELATED ART

As electronic devices have become slimmer in recent years, semiconductor packages are concomitantly required to be lighter, thinner, shorter, and smaller, and to have high-integration and high electrical properties. To accomplish this miniaturizing of electronic devices, there is a growing trend towards wafer thinning and increasing complexity of comprising structures.

Accordingly, in the case of a process in which a pick and place operation is performed, a phenomenon in which semiconductor chips scatter and are thus are stuck into unintended regions of a collet increases. In addition the color of the semiconductor chip may be altered by temperature induced changes during wafer manufacture. Thus, when the under vision process is used to inspect for cracks in a semiconductor chip, an instantaneous stop may occur, causing misrecognition of a size or error-detection of a defect.

SUMMARY

According to an exemplary embodiment of the present inventive concept, a collet apparatus is provided including a body. A first adsorption unit is connected to the body. A second adsorption unit is connected to the first adsorption unit. The second adsorption unit adsorbs a semiconductor chip. An illumination unit is disposed inside the body and provides a light to the semiconductor chip adsorbed onto the second adsorption unit to examine the semiconductor chip.

According to an exemplary embodiment of the present inventive concept, a collet apparatus is provided including a body. An illumination unit is disposed inside the body and provides a light to a semiconductor chip to examine the semiconductor chip. A first adsorption unit is connected to a lower portion of the body. The first adsorption unit allows light to penetrate therethrough. The first adsorption unit has a first hardness. A second adsorption unit is connected to a lower portion of the first adsorption unit. The second adsorption unit allows the light to penetrate therethrough the second adsorption unit has a second hardness that is smaller than the first hardness. The semiconductor chip is adsorbed onto the second adsorption unit. An air intake unit is connected to the second adsorption unit and adsorbs the semiconductor chip. A fixing unit is disposed on a lower surface of the body and is connected with the first adsorption unit, and a connection pad is disposed on an upper surface of the first adsorption unit and connects with the body and is fixed thereto by the fixing unit.

According to an exemplary embodiment of the present inventive concept, a method for fabricating a semiconductor device is provided including adsorbing a semiconductor chip onto an adsorption unit disposed on a lower portion of a body of a collet apparatus. At least one light source is selected corresponding to a pattern formed on the semiconductor chip from among a plurality of light sources arranged inside the collet apparatus. The semiconductor chip is examined by using a light provided from the selected at least one light source. The examined semiconductor chip is attached onto a substrate. The adsorption unit is substantially transparent.

BRIEF DESCRIPTION OF THE DRAWINGS

The above and other aspects and features of the present disclosure will become more apparent by describing exemplary embodiments thereof in detail with reference to the attached drawings, in which:

FIGS. 12 to 15 are side views illustrating intermediate stages of fabrication in a method for fabricating a semiconductor device using a collet apparatus according to an exemplary embodiment of the present inventive concept.

DETAILED DESCRIPTION OF THE EMBODIMENTS

Figure 1:
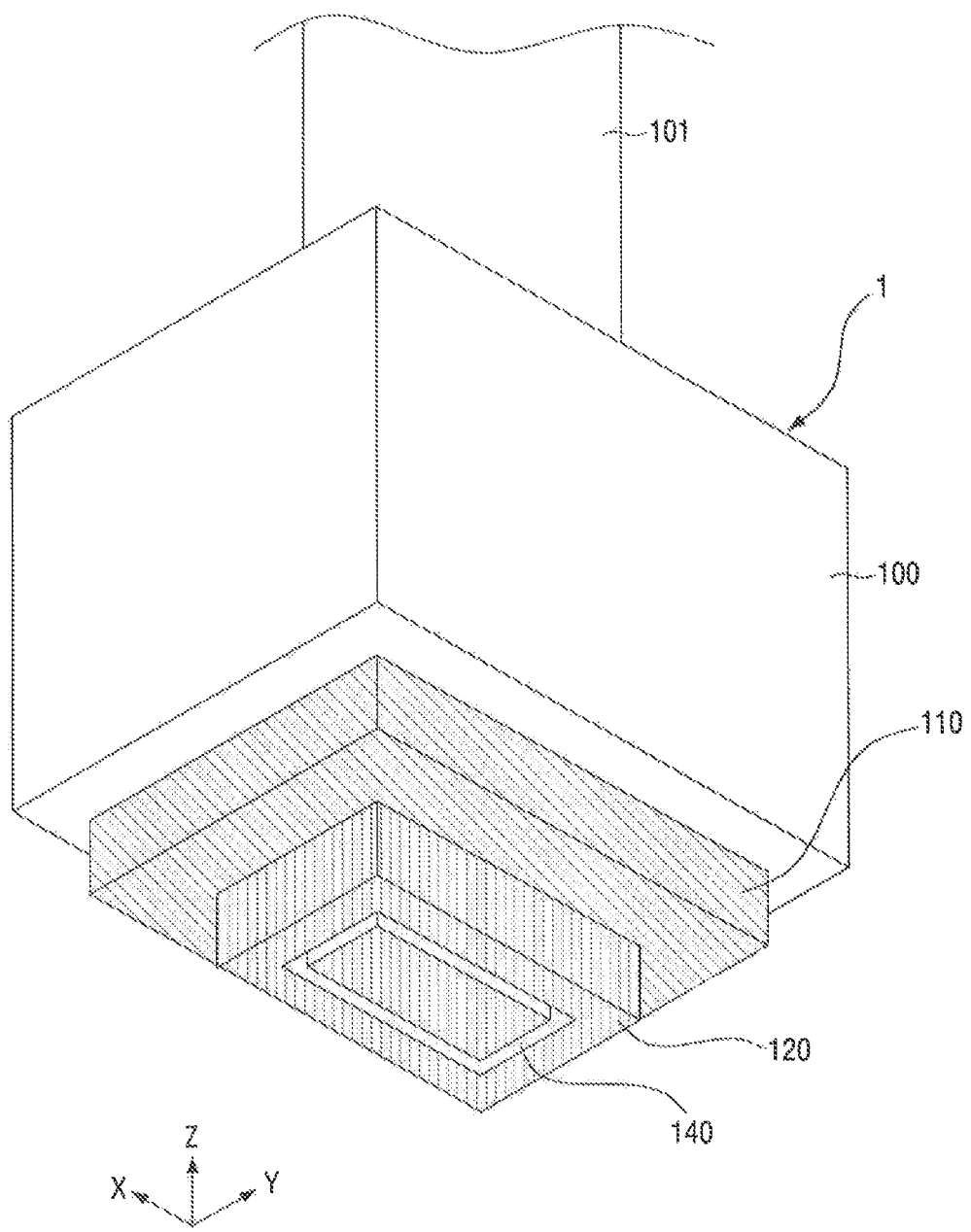
FIG. 1 is a perspective view illustrating a collet apparatus according to an exemplary embodiment of the present inventive concept.
Figure 2:
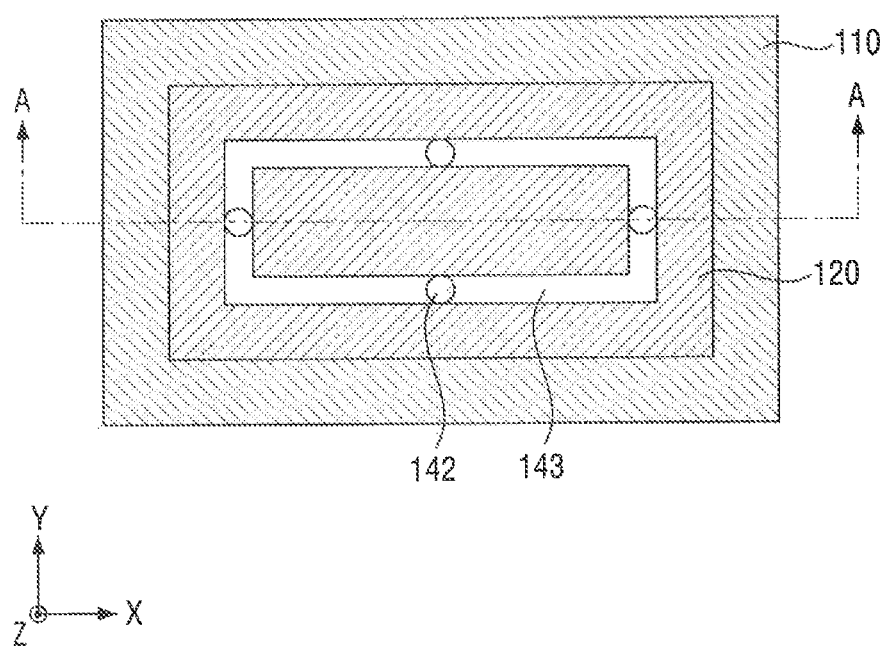
FIG. 2 is a bottom view illustrating an adsorption unit used in the collet apparatus according to an exemplary embodiment of the present inventive concept.
Figure 3:
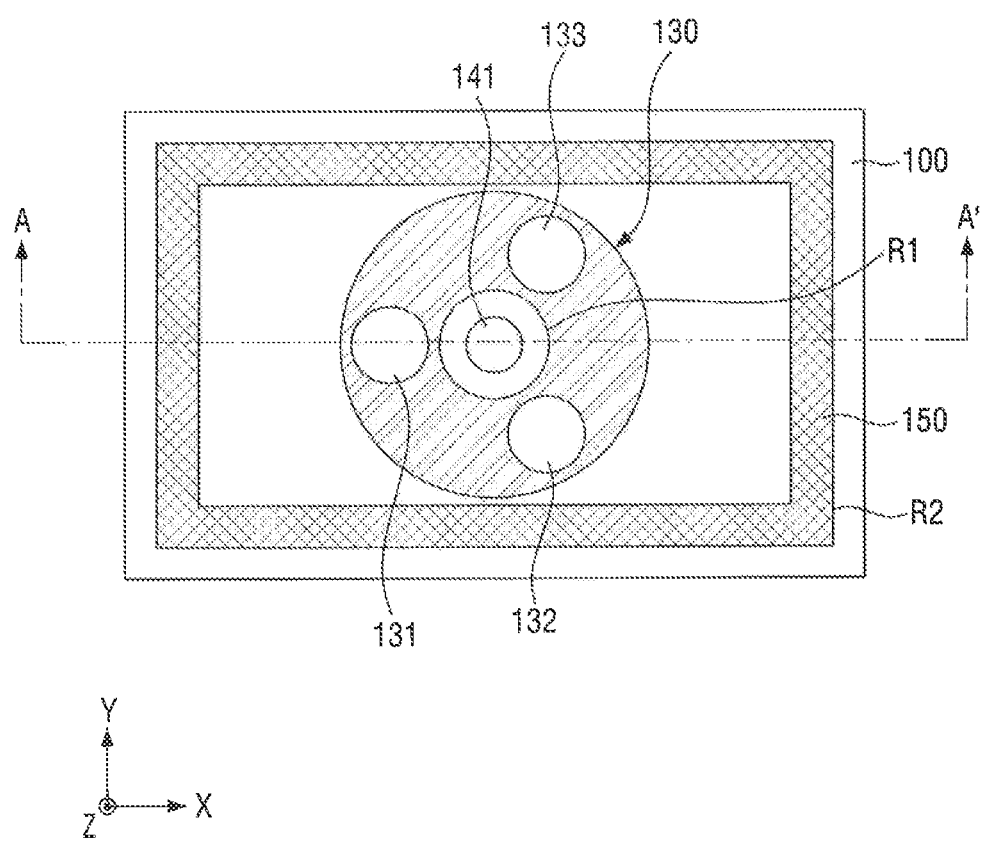
FIG. 3 is a bottom view illustrating a body portion used in the collet apparatus according to an exemplary embodiment of the present inventive concept.
Figure 4:
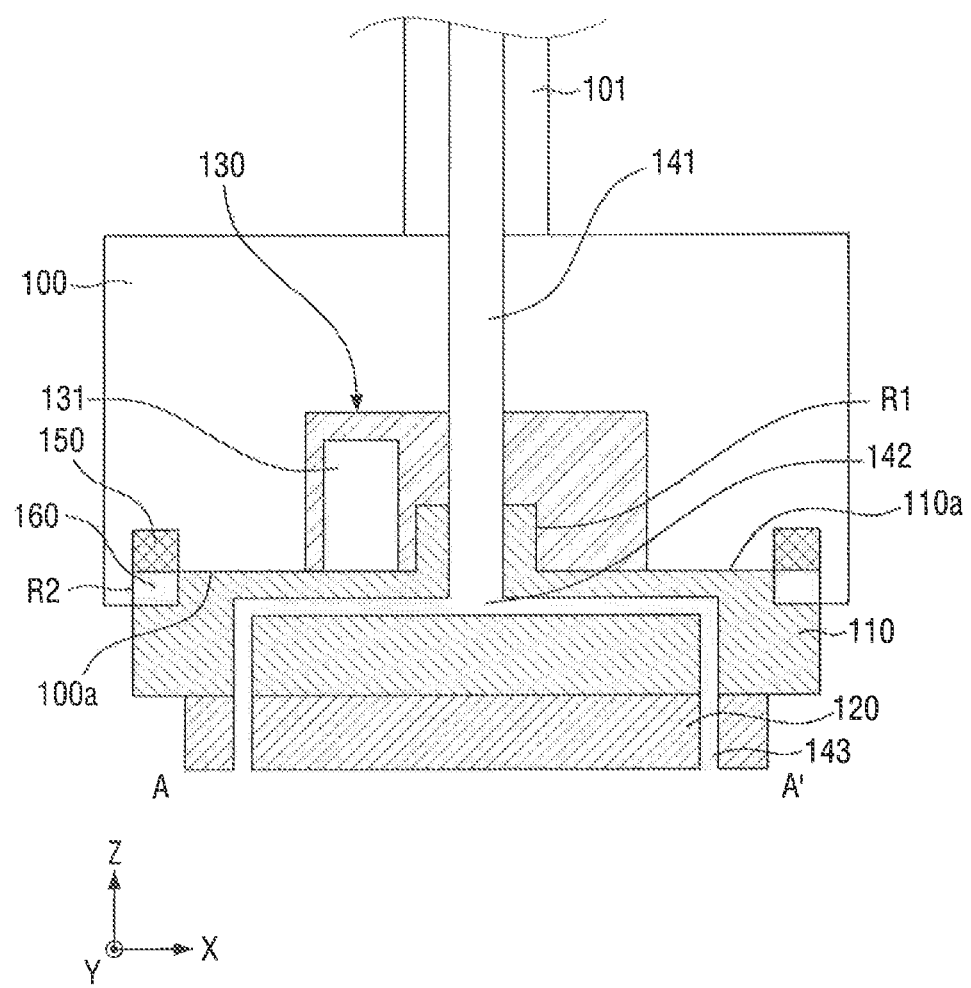
FIG. 4 is a cross-section illustrating a cross-sectional view taken along line A-A' of FIGS. 2 and 3 according to an exemplary embodiment of the present inventive concept.
Figure 5:
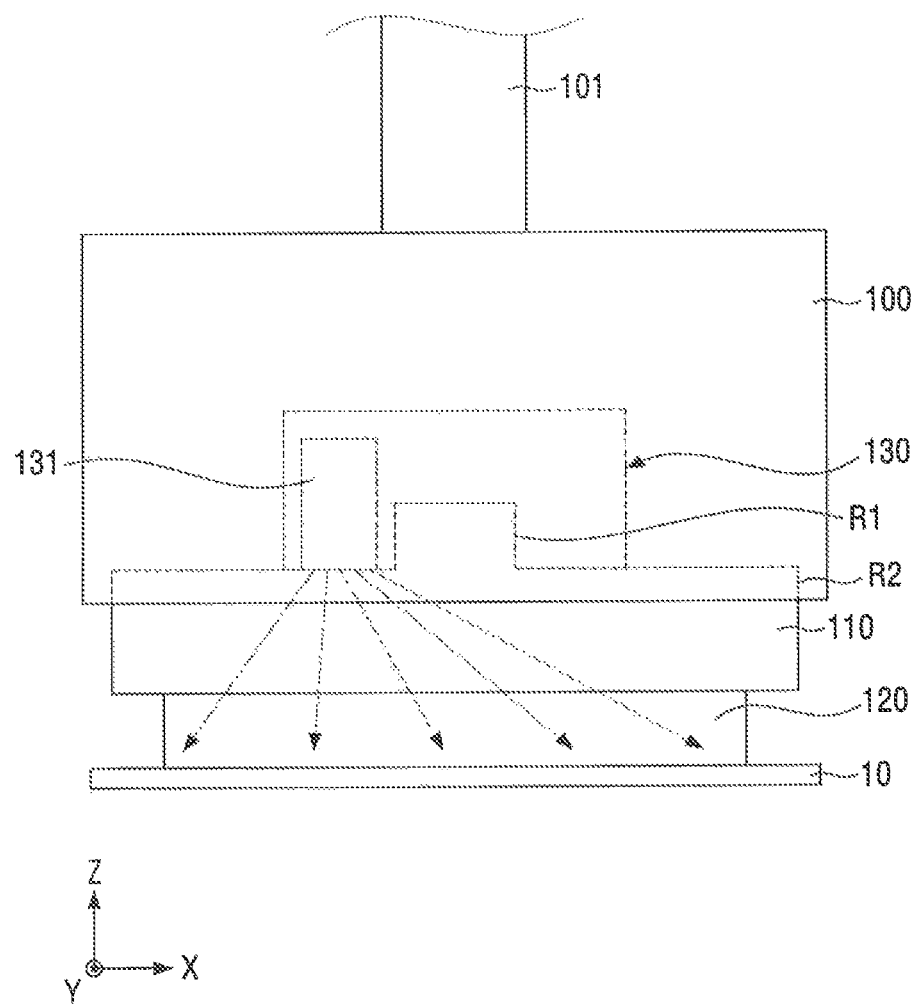
FIG. 5 is a side view illustrating an operation of the illumination unit used in the collet apparatus according to an exemplary embodiment of the present inventive concept.

Hereinafter, the present inventive concept will be described more fully with reference to the accompanying drawings in which various exemplary embodiments are shown. FIG. 1 is a perspective view illustrating a collet apparatus according to an exemplary embodiment of the present inventive concept. FIG. 2 is a bottom view illustrating an adsorption unit used in the collet apparatus according to an exemplary embodiment of the present inventive concept. FIG. 3 is a bottom view illustrating an illumination unit of a body used in the collet apparatus according to an exemplary embodiment of the present inventive concept. FIG. 4 is a cross-section illustrating a cross-sectional view taken along line A-A' of FIGS. 2 and 3. FIG. 5 is a side view illustrating an operation of the illumination unit used in the collet apparatus according to an exemplary embodiment of the present inventive concept.

Referring to FIGS. 1 to 5, the collet apparatus according to an exemplary embodiment of the present inventive concept includes a body 100, a connection portion 101, a first adsorption unit 110, a second adsorption unit 120, an illumination unit 130, an air intake unit 140, a fixing unit 150, and a connection pad 160.

The connection portion 101 may be connected with the body 100. For example, the connection portion 101 may be connected to an upper surface of the body 100. The collet apparatus 1 may be connected to an external apparatus through the connection portion 101. For example, the external apparatus may contain components used in the performance of various functions of the collet apparatus 1, such as an image sensor, a processor, and a guide track.

The illumination unit 130 may be disposed inside the body 100. The illumination unit 130 may be exposed on a lower surface 100a of the body 100. For example, the exposed region of the illumination unit 130 may be disposed on the first adsorption unit 110. FIG. 3 depicts that a planar shape of the illumination unit 130 is a circle, but this is merely an example and the planar shape of the illumination unit 130 is not particularly limited. The illumination unit 130 may be disposed at a center region of the lower surface 100a of the body 100.

The illumination unit 130 may include a plurality of light sources. For example, the illumination unit 130 may include first to third light sources 131, 132, 133. The first to third light sources 131, 132, 133 may be arranged to be spaced apart from one another. However, the present inventive concept is not limited thereto. For example, in an exemplary embodiment of the present inventive concept, the first to third light sources 131, 132, 133 may be arranged adjacent to one another. Each of the first to third light sources 131, 132, 133 may be exposed on the lower surface 100a of the body 100. Lines connecting adjacent centers of the first to third light sources 131, 132, and 133 may form an equilateral triangle, but the present inventive concept is not limited thereto. For example, the first to third light sources 131, 132, and 133 may be irregularly spaced in a plan view and/or clustered around less than a full circumference of the first recess R1.

Each of the first to third light sources 131, 132, 133 may provide a light of a different wavelength. For example, the first light source 131 may provide a red light, the second light source 132 may provide a blue light, and the third light source 133 may provide a green light.

Each of the first to third light sources 131, 132, 133 may be, for example, a light emitting diode (LED) light source, but the present inventive concept is not limited thereto.

The first adsorption unit 110 may be connected to a lower portion of the body 100. A center portion of the first adsorption unit 110 may be inserted into an inside of a first recess R1 formed in the illumination unit 130. However, the present inventive concept is not limited thereto. For example, the first recess R1 formed in the illumination unit 130 may accommodate a vertically extending portion of the first adsorption unit 110, and the vertically extending portion of the first adsorption unit 110 may have a complimentary shape, such as an annulus.

At least a part of an upper portion of the first adsorption unit 110 may be inserted into an inside of a second recess R2 formed on the lower surface 100a of the body 100. For example, the second recess R2 may have a closed line rectangular shape with sides that are disposed inside edges of corresponding sides of the lower surface 100a of the body 100 in a plan view, and the portion of the first adsorption unit 110 disposed therein may have a complimentary shape. A width of the second recess R2 may be greater than a width of the first recess R1. For example, a width between parallel sides of the second recess R2 may be greater than a diameter of the annulus of the first recess R1.

A part of the first adsorption unit 110 is inserted into the first recess R1 formed on the illumination unit 130 and the second recess R2 formed on the body 100, such that the first adsorption unit 110 can be stably connected to the body 100.

The first adsorption unit 110 may allow light provided from the first to third light sources 131, 132, 133 to penetrate therethrough. For example, the first adsorption unit 110 may include a material having high transparency. For example, the first adsorption unit 110 may include acryl and/or polystyrene. However, the present inventive concept is not limited thereto. For example, the first adsorption unit 110 may include a high transparency material in addition to acryl and polystyrene, or the first adsorption unit 110 may include another material(s) having high transparency other than acryl and polystyrene.

The second adsorption unit 120 may be connected to a lower portion of the first adsorption unit 110. For example the second adsorption unit 120 may be disposed at an opposite surface to the upper surface 110a of the first adsorption unit 110 that is in contact with the lower surface 100a of the body 100. A width of the second adsorption unit 120 in a first direction (e.g., an X direction) may be formed to be smaller than a width of the first adsorption unit 110 in the first direction (e.g., the X direction). In addition, a width of the second adsorption unit 120 in a second direction (e.g., a Y direction) perpendicular to the first direction (e.g., the X direction) may be formed to be smaller than a width of the first adsorption unit 110 in the second direction (e.g., the Y direction).

Although FIG. 1 depicts that a lower surface of the first adsorption unit 110 is planar and the second adsorption unit 120 is connected to the lower surface of the first adsorption unit 110, the present inventive concept is not limited thereto. For example, in an exemplary embodiment of the present inventive concept, at least a part of an upper surface of the second adsorption unit 120 may be inserted into a corresponding recess formed in the first adsorption unit 110.

The second adsorption unit 120 may allow light provided from the first to third light sources 131, 132, 133 to penetrate therethrough. For example, the second adsorption unit 120 may include a material having a high transparency. The second adsorption unit 120 may include, for example reinforced plastic and/or glass. However, the present inventive concept is not limited thereto.

A first hardness of the first adsorption unit 110 may be greater than a second hardness of the second adsorption unit 120.

A semiconductor chip 10 may be adsorbed onto a lower surface of the second adsorption unit 120. The semiconductor chip 10 may be, for example, a logic semiconductor chip, a memory semiconductor chip, a semiconductor package, or an interposer.

The logic semiconductor chip may be, for example, a central processing unit (CPU), a controller or an application specific integrated circuit (ASIC) or the like.

The memory semiconductor chip may be, for example, a volatile memory semiconductor chip such as a dynamic random access memory (DRAM) or a static random access memory (SRAM), or a nonvolatile memory semiconductor chip such as a phase-change random access memory (PRAM), a magnetoresistive random access memory (MRAM), a ferroelectric random access memory (FeRAM), or a resistive random access memory (RRAM). However, the present inventive concept is not limited thereto.

A configuration for having the semiconductor chip 10 adsorbed onto the second adsorption unit 120 will be described below in detail.

The connection pad 160 may be disposed on an upper surface 110a of the first adsorption unit 110 connected with the lower surface 100a of the body 100. For example, the connection pad 160 may be disposed along an edge of the upper surface 110a of the first adsorption unit 110. However, the present inventive concept is not limited thereto.

The connection pad 160 may include, for example, metal which is attached by a magnet.

The fixing unit 150 may be disposed in the lower surface 100a of the body 100 connected with the upper surface 110a of the first adsorption unit 110. The fixing unit 150 may be disposed in a position corresponding to the connection pad 160. For example, the fixing unit 150 may be disposed to overlap the connection pad 160 in a third direction (e.g., a Z direction) which is perpendicular to the first and second directions (e.g., the X and Y directions, respectively).

The fixing unit 150 may include, for example, a magnet. The connection pad 160 may be attached and fixed to the fixing unit 150 by the magnet.

The air intake unit 1400 may penetrate through the connection portion 101, the body 100, the illumination unit 130, the first adsorption unit 110, and the second adsorption unit 120. The air intake unit 140 may draw in air and may have the semiconductor chip 10 adsorbed onto the lower surface of the second adsorption unit 120.

The air intake unit 140 may include a first air intake hole 141, a second air intake hole 142, and an air intake line 143.

The first air intake hole 141 may be disposed as a channel penetrating through the connection portion 101, the body 100, and the illumination unit 130 in the third direction (e.g., the Z direction).

The second air intake hole 142 may be connected with the first air intake hole 141 at a lower surface of the first air intake hole 141. The second air intake hole 142 may be disposed inside the first adsorption unit 110. The air intake line 143 may be connected with the second air intake hole 142. The air intake line 143 may have a line shape extended in the first direction (e.g. the X direction) and the second direction (e.g. the Y direction), respectively. For example, the air intake line 143 may have a shape to be disposed along a rectangular edge. However, the present disclosure is not limited thereto.

Air may be drawn in through the air intake line 143, the second air intake hole 142, and the first air intake hole 141. For example, passages of the air intake line 143, the second air intake hole 142, and the first air intake hole 141 may be integrated with one another. The semiconductor chip 10 may be adsorbed onto the lower surface of the second adsorption unit 120 by using the drawn-in air.

Referring to FIG. 5, at least one of the first to third light sources 131, 132, 133 included in the illumination unit 130 may provide light to the semiconductor chip 10 adsorbed onto the second adsorption unit 120.

For example, at least one of the first to third light sources 131, 132, 133 may provide light to the semiconductor chip 10 after the semiconductor chip 10 is adsorbed onto the second adsorption unit 120. FIG. 5 illustrates that the first light source 131 provides red lights to the semiconductor chip 10.

The light provided from at least one of the first to third light sources 131, 132, 133 may be provided to the entire upper surface of the semiconductor chip 10. For example, as shown in FIG. 5, the light provided from at least one of the first to third light sources 131, 132, 133 may be configured to be dispersed in the first direction (e.g., the X direction). In this case, the first to third light sources 131, 132, 133 may provide light to the semiconductor chip 10 in sequence. In addition, at least two of the first to third light sources 131, 132, 133 may provide light to the semiconductor chip 10 in sequence.

When the red light provided from the first light source 131 and the blue light provided from the second light source 132 are provided simultaneously, a magenta light which is a combination of the red light and the blue light may be provided to the semiconductor chip 10.

When the blue light provided from the second light source 132 and the green light provided from the third light source 133 are provided simultaneously, a cyan light which is a combination of the blue light and the green light may be provided to the semiconductor chip 10.

When the green light provided from the third light source 133 and the red light provided from the first light source 131 are provided simultaneously, a yellow light which is a combination of the green light and the red light may be provided to the semiconductor chip 10.

When the red light provided from the first light source 131, the blue light provided from the second light source 132, and the green light provided from the third light source 133 are provided simultaneously, a white light which is a combination of the red light, the blue light, and the green light may be provided to the semiconductor chip 10.

The illumination unit 130 may select at least one of the first to third light sources 131, 132, 133 to correspond to a pattern formed on the semiconductor chip 10. For example, the illumination unit 130 may select a light source to provide light for clearly recognizing the pattern formed on the semiconductor chip 10 from among the lights provided from at least one of the first to third light sources 131, 132, 133.

Subsequently, the illumination unit 130 may examine a crack formed on the semiconductor chip 10 by providing light to the semiconductor chip 10 from the selected at least one light source.

In the collet apparatus according to an exemplary embodiment of the present inventive concept, the first adsorption unit 110 connecting the body 100 and the second adsorption unit 120 is formed to have the higher hardness than that of the second adsorption unit 120 onto which the semiconductor chip 10 is adsorbed, such that the semiconductor chip 10 can be prevented from being stuck into the first adsorption unit 110.

In addition, the collet apparatus according to an exemplary embodiment of the present inventive concept selects at least one of the lights provided from the plurality of light sources that can allow the pattern formed on the semiconductor chip 10 to be most clearly recognized, such that the pattern formed on the semiconductor chip 10 can be effectively recognized.

In addition, the collet apparatus according to an exemplary embodiment of the present inventive concept can examine a crack formed on the semiconductor chip 10 by using the plurality of light sources arranged inside the collet apparatus.

Hereafter, a collet apparatus according to an exemplary embodiment of the present inventive concept will be described with reference to FIGS. 6 and 7. The difference from the collet apparatus illustrated in FIGS. 3 and 4 will be highlighted.

Figure 6:
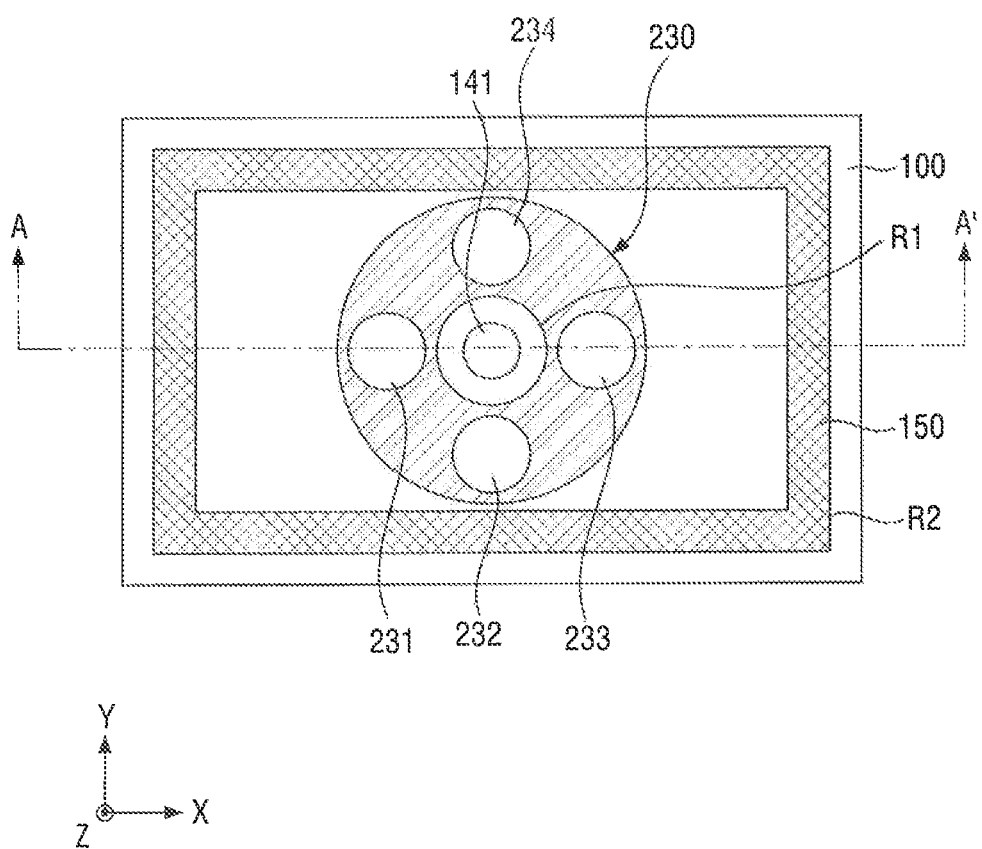
FIG. 6 is a bottom view illustrating a body portion of a collet apparatus according to an exemplary embodiment of the present inventive concept.

FIG. 6 is a bottom view of the body 100 of a collet apparatus according to an exemplary embodiment of the present inventive concept. FIG. 7 is a cross-sectional view illustrating a cross-section taken along line A-A' of FIG. 6.

Figure 7:
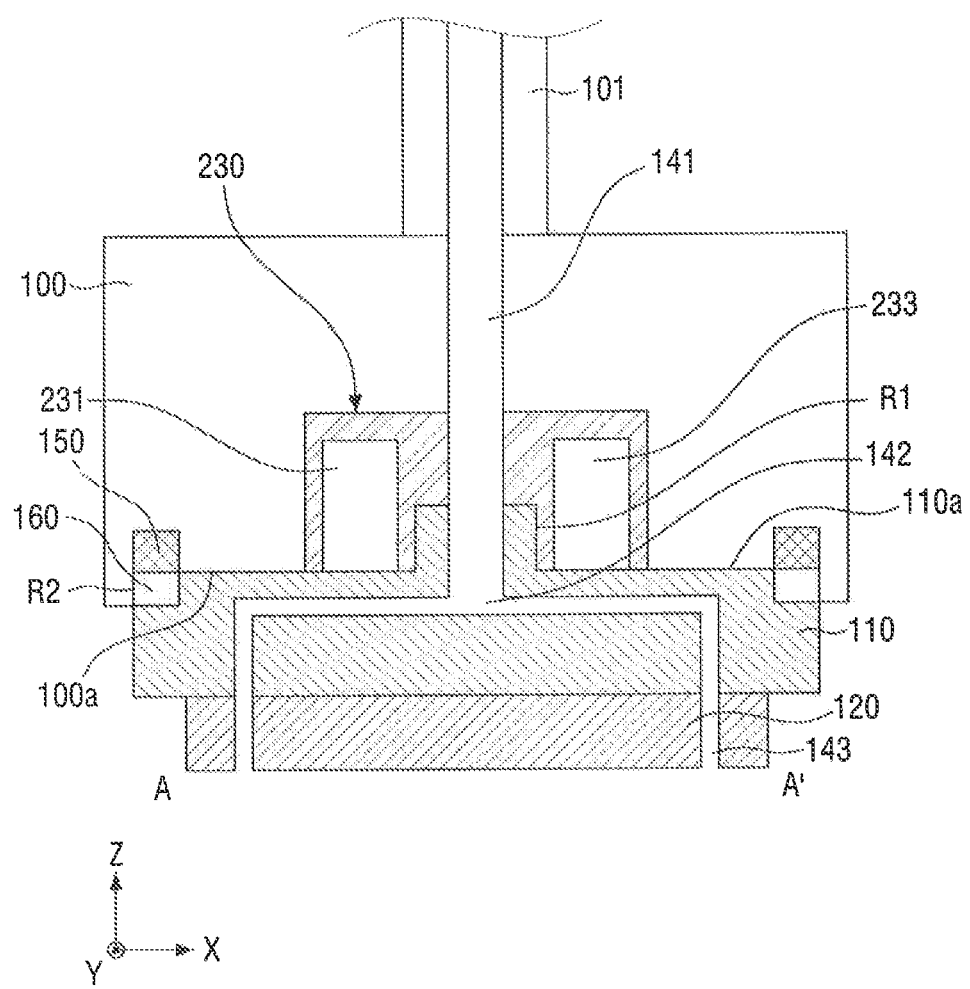
FIG. 7 is a cross-section illustrating a cross-sectional view taken along line A-A' of FIG. 6 according to an exemplary embodiment of the present inventive concept.

Referring to FIGS. 6 and 7, in the collet apparatus according to an exemplary embodiment of the present inventive concept, an illumination unit 230 may include first to fourth light sources 231, 232, 233, 234.

For example, the illumination unit 230 may include the first light source 231 to provide a red light, the second light source 232 to provide a blue light, the third light source 233 to provide a green light, and the fourth light source 234 to provide a black light.

The first to fourth light sources 231, 232, 233, 234 may be arranged to be evenly spaced apart from one another around the circumference of the first recess R1. The light sources 231, 232, 233, 234 may be disposed in pairs of two separated by the first recess R. Axes passing through centers of respective pairs may be orthogonally intersecting. However, the present inventive concept is not limited thereto. For example, in an exemplary embodiment of the present inventive concept, the first to fourth light sources 231, 232, 233, 234 may be arranged adjacent to one another and clustered together around less than a full circumference of the first recess R1 at irregular or regular intervals.

Hereafter, a collet apparatus according to an exemplary embodiment of the present inventive concept will be described with reference to FIGS. 8 and 9. The difference from the collet apparatus illustrated in FIGS. 3 and 5 will be highlighted.

Figure 8:
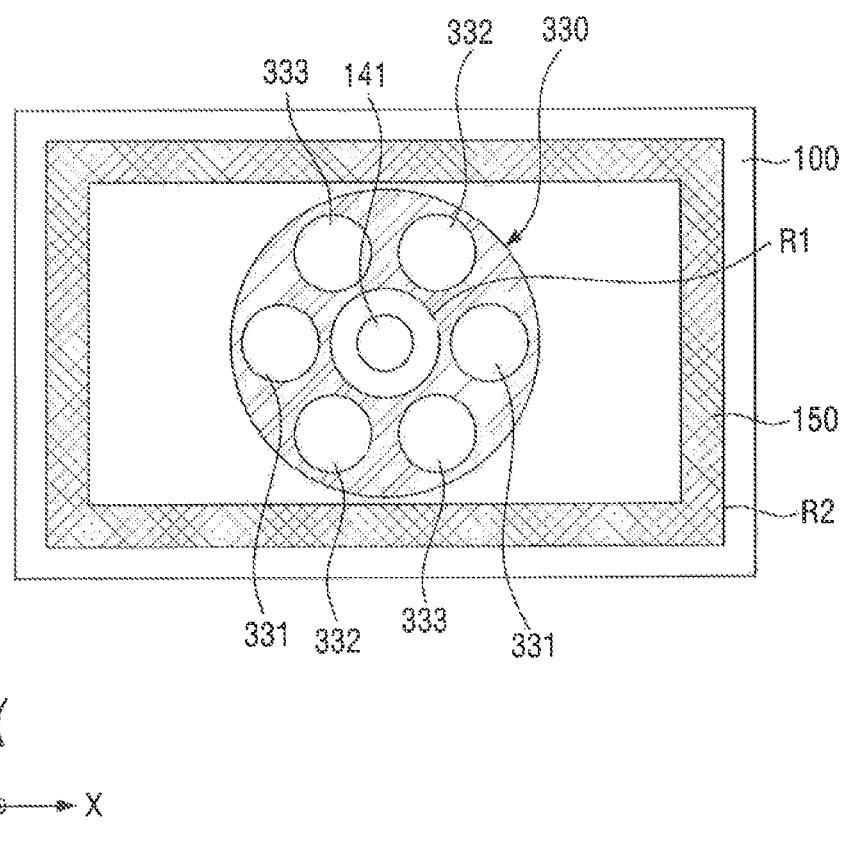
FIG. 8 is a bottom view illustrating a body portion of a collet apparatus according to an exemplary embodiment of the present inventive concept.

FIG. 8 is a bottom view of the body 100 illustrating a collet apparatus according to an exemplary embodiment of the present inventive concept. FIG. 9 is side a view provided to explain an operation of an illumination unit used in the collet apparatus according to some other exemplary embodiments.

Figure 9:
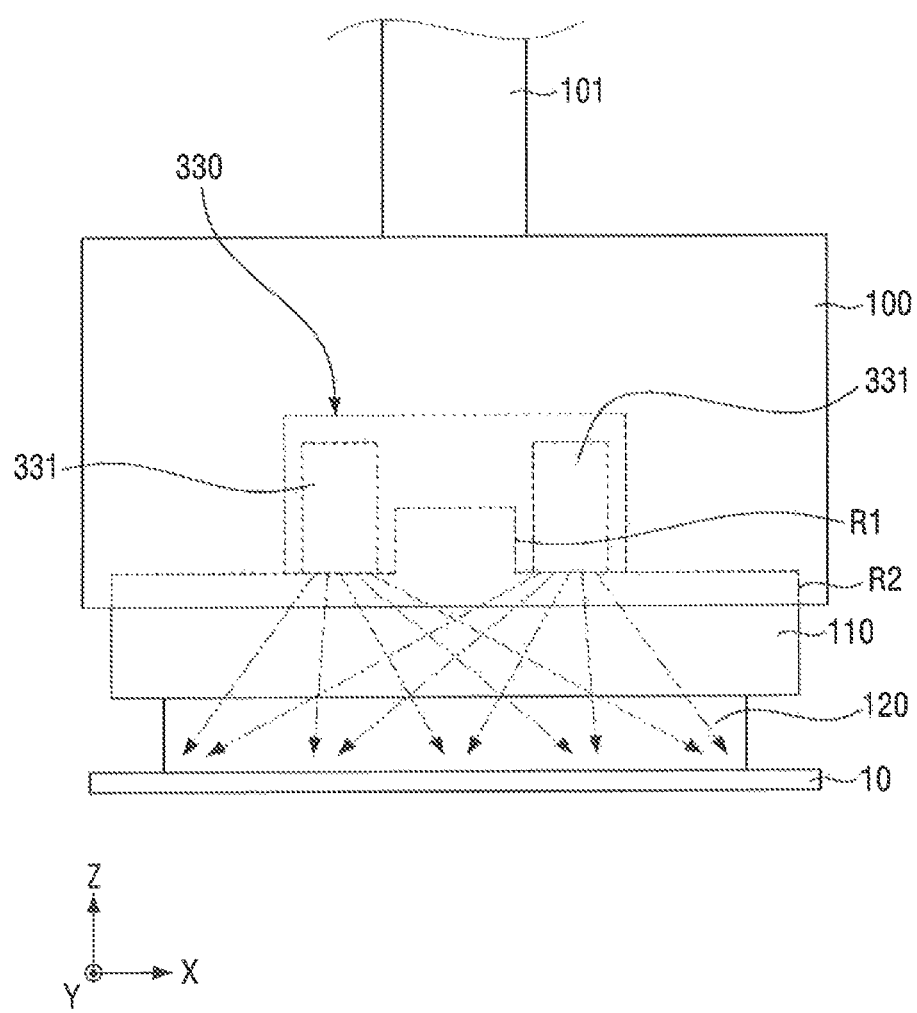
FIG. 9 is a side view illustrating an operation of an illumination unit used in the collet apparatus according to an exemplary embodiment of the present inventive concept.

Referring to FIGS. 8 and 9, in the collet apparatus according to an exemplary embodiment of the present inventive concept, an illumination unit 330 may include first to third light sources 331, 332, 333.

The illumination unit 330 may include two of each of the first to third light sources 331, 332, 333. For example, the two first light sources 331 may be arranged to be symmetric with respect to the first air intake hole 141. The two second light sources 332 may be arranged to be symmetric with respect to the first air intake hole 141. The two third light sources 333 may be arranged to be symmetric with respect to the first air intake hole 141.

The first light source 331 may provide a red light, the second light source 332 may provide a blue light, and the third light source 333 may provide a green light.

FIG. 9 illustrates that each of the two first light sources 131 provides the red light to the semiconductor chip 10. A portion of the dispersed light transmitted by the two first light sources 131 may intersect in a region overlapping the first recess R1 in the third direction (e.g., the Z direction).

The light sources 331, 332, 333 may be arranged to be spaced apart from one another at regular intervals around the perimeter of the first recess R. However, the present inventive concept is not limited thereto. For example, in an exemplary embodiment of the present inventive concept, the light sources 331, 332, 333 may be clustered together at regular or irregular intervals around less than an entire circumference of the first recess R1.

Hereafter, a collet apparatus according to an exemplary embodiment of the present inventive concept will be described with reference to FIG. 10. The difference from the collet apparatus illustrated in FIG. 3 will be highlighted.

Figure 10:
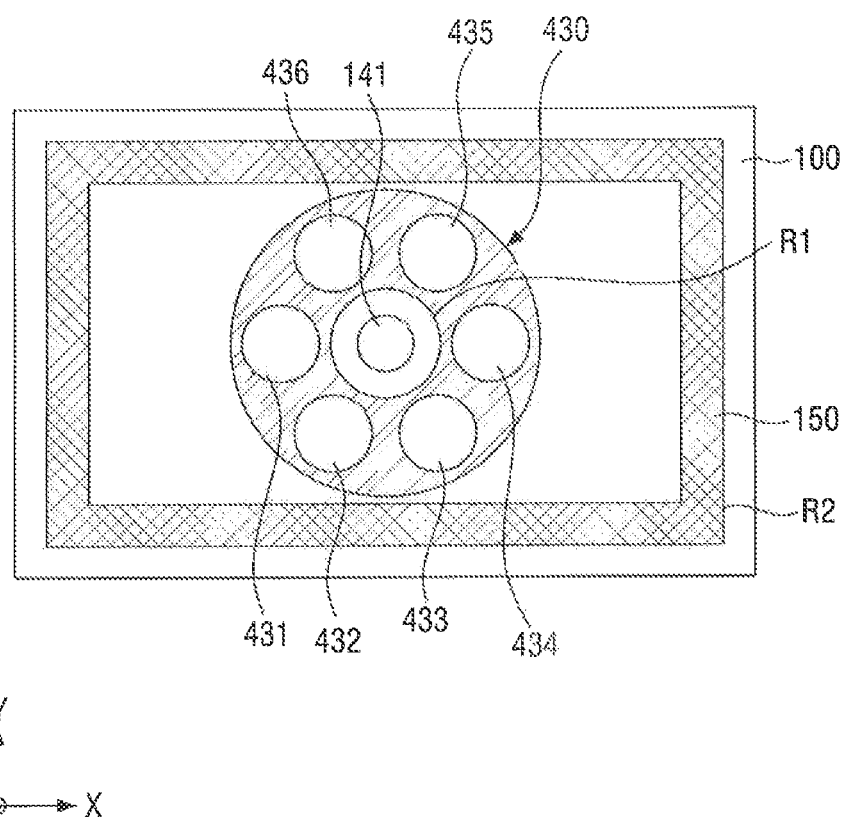
FIG. 10 is a bottom view illustrating a body portion of a collet apparatus according to an exemplary embodiment of the present inventive concept.

FIG. 10 is a bottom view illustrating a body 100 of a collet apparatus according to an exemplary embodiment of the present inventive concept.

Referring to FIG. 10, in the collet apparatus according to an exemplary embodiment of the present inventive concept, an illumination unit 430 may include first to sixth light sources 431, 432, 433, 434, 435, 436.

For example, the illumination unit 430 may include the first light source 431 to provide a red light, the second light source 432 to provide a blue light, the third light source 433 to provide a green light, the fourth light source 434 to provide a black light, the fifth light source 435 to provide a yellow light, and the sixth light source 436 to provide a white light.

The first to sixth light sources 431, 432, 433, 434, 435, 436 may be arranged to be spaced apart from one another around the circumference of the first recess R1. However, the present inventive concept is not limited thereto. For example, in an exemplary embodiment of the present inventive concept, the first to sixth light sources 431, 432, 433, 434, 435, 436 may be arranged adjacent to one another at a regular or irregular interval around less than an entire circumference of the first recess R1.

Hereinafter, a method for fabricating a semiconductor device using a collet apparatus according to an exemplary embodiment of the present inventive concept will be described with reference to FIG. 4 and FIGS. 11 to 15.

Figure 11:
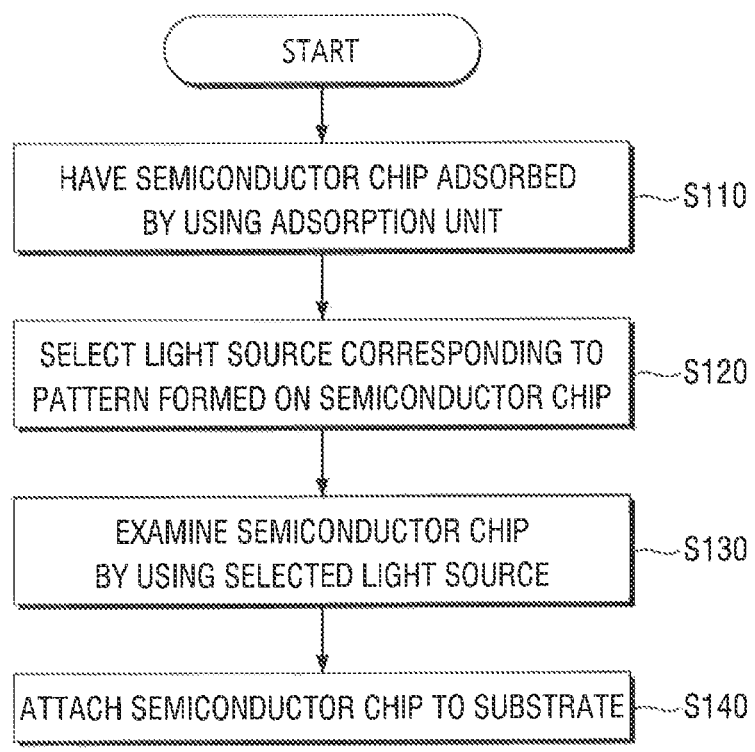
FIG. 11 is a flowchart illustrating a method for fabricating a semiconductor device using a collet apparatus according to an exemplary embodiment of the present inventive concept.

FIG. 11 is a flowchart explaining a method for fabricating a semiconductor device using a collet apparatus according to an exemplary embodiment of the present inventive concept. FIGS. 12 to 15 are side views illustrating intermediate stages of fabrication, in a method for fabricating a semiconductor device using a collet apparatus according to an exemplary embodiment of the present inventive concept.

Referring to FIG. 12, a plurality of semiconductor chips 10 which are spaced apart from one another may be formed by cutting a wafer positioned on a first stage 20.

Referring to FIG. 4 and FIGS. 1 and 13, the collet apparatus 1 may be moved above the semiconductor chip 10. Next, the collet apparatus 1 may descend and may have the semiconductor chip 10 adsorbed onto the lower surface of the second adsorption unit 120 (S110).

The collet apparatus 1 may have the semiconductor chip 10 adsorbed onto the lower surface of the second adsorption unit 120 by drawing in air by using the air intake unit 140.

Next, the collet apparatus 1 may ascend with the semiconductor chip 10 being adsorbed onto the lower surface of the second adsorption unit 120.

Referring to FIG. 4 and FIGS. 11 and 14, the collet apparatus 1 may be moved above a guide illumination unit 30.

Next, the guide illumination unit 30 may provide light to the semiconductor chip 10. The guide illumination unit 30 may provide a white light.

The illumination unit 130 may select at least one of the first to third light sources 131, 132, 133 to correspond to a pattern formed on the semiconductor chip 10 (S120). For example, the illumination unit 130 may select a light source to provide light for clearly recognizing the pattern formed on the semiconductor chip 10 from among lights provided from at least one of the first to third light sources 131, 132, 133.

In this case, the lights provided from the first to third light sources 131, 132, 133 may penetrate through the first adsorption unit 110 and the second adsorption unit 120.

Next, the illumination unit 130 may examine a crack formed on the semiconductor chip 10 by using the light provided from the at least one light source selected (S130).

Referring to FIG. 4 and FIGS. 11 and 15, the collet apparatus 1 may be moved above a second stage 50 on which a substrate 40 is positioned after the examination of the semiconductor chip 10 is completed.

Next, the collet apparatus 1 may descend and may have the semiconductor chip 10 adsorbed onto the substrate 40 (S140).

For example, the collet apparatus 1 may descend and bring the semiconductor chip 10 into contact with an upper surface of the substrate 40, and then, may have the semiconductor chip 10 attached to the upper surface of the substrate 40 by stopping the drawing in of air through the air intake unit 140.

Herein, the substrate 40 may be, for example, any one of a printed circuit board (PCB), an interposer, other semiconductor chip(s) and a semiconductor package. However, the present inventive concept is not limited thereto.

Next, after the semiconductor chip 10 is bonded to the substrate 40, the semiconductor chip 10 may be electrically connected with the substrate 40 through a wire or TSV.

Next, a semiconductor device or a semiconductor package may be fabricated by forming a mold layer to cover the semiconductor chip 10.

Although exemplary embodiments of the present inventive concept have been described heretofore, it will be understood by those skilled in the art that various changes in form and details may be made herein without departing from the spirit and scope of the present inventive concept as set forth in the following claims.

What is claimed is:

1. A collet apparatus, comprising:
a body;
a first adsorption unit connected to the body;
a second adsorption unit connected to the first adsorption unit, the second adsorption unit adsorbing a semiconductor chip; and
an illumination unit disposed inside the body, and providing a light to the semiconductor chip adsorbed onto the second adsorption unit to examine the semiconductor chip.

2. The collet apparatus of claim 1, wherein the first adsorption unit and the second adsorption unit allow the light to penetrate therethrough.

3. The collet apparatus of claim 1, wherein a first hardness of the first adsorption unit is greater than a second hardness of the second adsorption unit.

4. The collet apparatus of claim 1, wherein the first adsorption unit comprises reinforced plastic and/or glass, and
wherein the second adsorption unit comprises acryl.

5. The collet apparatus of claim 1, further comprising:
a fixing unit disposed on a lower surface of the body connected with the first adsorption unit; and
a connection pad disposed on an upper surface of the first adsorption unit, the connection pad connected to the fixing unit.

6. The collet apparatus of claim 5, wherein the fixing unit comprises a magnet, and the connection pad comprises a metal.

7. The collet apparatus of claim 5, wherein the connection pad is disposed along an edge of the upper surface of the first adsorption unit.

8. The collet apparatus of claim 1, further comprising an air intake unit connected to the second adsorption unit.

9. The collet apparatus of claim 8, wherein the air intake unit comprises:
a first air intake hole disposed inside the body;
a second air intake hole connected with the first air intake hole and disposed inside the first adsorption unit; and
an air intake line connected with the second air intake hole and disposed inside the second adsorption unit.

10. The collet apparatus of claim 1, wherein the illumination unit comprises a plurality of light sources providing lights of different wavelengths.

11. The collet apparatus of claim 10, wherein the plurality of light sources comprise:
a first light source providing a red light;
a second light source providing a blue light; and
a third light source providing a green light.

12. The collet apparatus of claim 11, wherein the plurality of light sources further comprise:
a fourth light source providing a black light.

13. The collet apparatus of claim 12, wherein the plurality of light sources further comprise:
a fifth light source providing a yellow light; and
a sixth light source providing a white light.

14. A collet apparatus, comprising:
a body;
an illumination unit disposed inside the body and providing a light to a semiconductor chip to examine the semiconductor chip;
a first adsorption unit connected to a lower portion of the body, the first adsorption unit allowing the light to penetrate therethrough, the first adsorption unit having a first hardness;
a second adsorption unit connected to a lower portion of the first adsorption unit, the second adsorption unit allowing the light to penetrate therethrough the second adsorption unit having a second hardness that is smaller than the first hardness, wherein the semiconductor chip is adsorbed onto the second adsorption unit;
an air intake unit connected to the second adsorption unit and adsorbing the semiconductor chip;
a fixing unit disposed on a lower surface of the body and connected with the first adsorption unit; and
a connection pad disposed on an upper surface of the first adsorption unit and connects with the body and fixed thereto by the fixing unit.

15. The collet apparatus of claim 14, wherein the illumination unit comprises a plurality of light sources providing lights of different wavelengths.

16. The collet apparatus of claim 14, wherein the first adsorption unit comprises reinforced plastic and/or glass, and
wherein the second adsorption unit comprises acryl.

17. The collet apparatus of claim 14, wherein the air intake unit comprises:
a first air intake hole disposed inside the body;
a second air intake hole connected with the first air intake hole and disposed inside the first adsorption unit; and an air intake line connected with the second air intake hole and disposed inside the second adsorption unit.

* * * * *